(12) United States Patent
Harrington et al.

(10) Patent No.: US 8,717,033 B2
(45) Date of Patent: May 6, 2014

(54) INTEGRATED MOSFET CURRENT SENSING FOR FUEL-GAUGING

(75) Inventors: David Harrington, Nashua, NH (US); Joseph B. Vanden Wymelenberg, Los Altos, CA (US); Marvin Lyle Peak, Jr., Highland Village, TX (US); Jason Allen Wortham, Fremont, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 393 days.

(21) Appl. No.: 13/236,009

(22) Filed: Sep. 19, 2011

(65) Prior Publication Data

US 2012/0081125 A1    Apr. 5, 2012

Related U.S. Application Data

(60) Provisional application No. 61/385,090, filed on Sep. 21, 2010, provisional application No. 61/385,475, filed on Sep. 22, 2010.

(51) Int. Cl.
*H01M 10/46* (2006.01)

(52) U.S. Cl.
USPC .......................................................... 324/427

(58) Field of Classification Search
USPC .......... 320/107, 128, 132, 149; 324/426, 427, 324/433
See application file for complete search history.

(56) References Cited

U.S. PATENT DOCUMENTS

| | | | | |
|---|---|---|---|---|
| 5,659,238 | A | * | 8/1997 | Faulk et al. .................... 320/136 |
| 5,789,904 | A | * | 8/1998 | Faulk et al. .................... 320/162 |
| 2010/0117592 | A1 | * | 5/2010 | Lim et al. ....................... 320/101 |

* cited by examiner

*Primary Examiner* — Edward Tso
(74) *Attorney, Agent, or Firm* — Blakely Sokoloff Taylor & Zafman LLP

(57) ABSTRACT

Integrated MOSFET current sensing for fuel-gauging. A $1^{st}$ MOSFET through which the current is to be sensed is coupled to a $2^{nd}$ MOSFET of the same type, the $2^{nd}$ MOSFET being biased to have the same resistance as the $1^{st}$ MOSFET. The $2^{nd}$ MOSFET has a much smaller area than the $1^{st}$ MOSFET, and is coupled to a current source representing a maximum current through the $1^{st}$ MOSFET. The voltage across the $1^{st}$ MOSFET relative to the voltage across the $2^{nd}$ MOSFET provides a measure of the current through the $1^{st}$ MOSFET. Various embodiments are disclosed, including embodiments in battery packs to eliminate the need for additional and expensive external components.

19 Claims, 5 Drawing Sheets

INTEGRATED MOSFET CURRENT SENSING FOR FUEL-GAUGING

CROSS-REFERENCE TO RELATED APPLICATIONS

This application claims the benefit of U.S. Provisional Patent Application No. 61/385,090 filed Sep. 21, 2010 and U.S. Provisional Patent Application No. 61/385,475 filed Sep. 22, 2010.

BACKGROUND OF THE INVENTION

1. Field of the Invention

The present invention relates to the field of fuel gauging for monitoring battery charge or battery state of charge.

2. Prior Art

Fuel-gauging technology can both predict and increase battery life, by monitoring the battery characteristics and state of charge, and making adjustments to the charging parameters as needed. One of the important input data needed for most fuel-gauge algorithms is an accurate sampling of battery current. The high accuracy required for the battery current measurement, and the need to measure the battery charge and discharge current under all conditions, has previously required an extra sense element inside the battery charge and discharge paths. This extra sense element, typically a small resistor, adds power loss during both battery charging and discharging, proportional to the voltage and current through the battery current sense element.

FIG. 1 shows the foregoing prior art. A current sense element, typically a resistor as shown by Rsense, is connected in series with the battery pack. This current sense element is then used to measure battery current by converting the voltage drop across the sense resistor to a digital representation. Typically a thermistor RTHM is also provided to sense the temperature of the battery, both for more accurate prediction of battery performance and for fault detection, which reading is also digitized. The information is then provided to the fuel-gauging algorithm.

Typical battery packs for cell phones, laptop computers and the like will include over current protection which will protect against excessive charging and discharging currents. For this purpose, of course, battery current needs to be measured, and accordingly a typical battery pack will include a current sense resistor in series with the actual battery, plus two series connected MOSFETs having an opposite body connection so as to be able to turn off either an excessive charging current or an excessive discharging current. In addition, charging current is generally sensed by an external current sense resistor in series with another transistor switch coupled to the output of a switching regulator. All of these devices must be capable of conducting the maximum currents allowed, and accordingly are both relatively large, and in the case of the sense resistors, relatively expensive because of their capacity and accuracy requirements. Further, of course, that many switches and sense resistors in series with particularly the charger is a significant source of heating and power loss, and for those devices actually packaged in the battery pack, the voltage drop across the switches and sense resistor will require a higher battery voltage before system shutdown, thereby limiting the discharge voltage to a higher voltage and thus the useful capacity of the battery to a lower capacity.

DETAILED DESCRIPTION OF THE PREFERRED EMBODIMENTS

Some embodiments of the present invention measure the battery charging and discharging current under all conditions while removing the need for, and eliminating, the extra sense element in series with the battery current. This reduces the power dissipation, resulting in a longer battery discharge time when the battery is powering a load, and a lower device temperature and power requirements when charging the battery. The battery current measurement is accomplished by:

1. Creating a reference voltage that represents the voltage that will occur across the battery charge/discharge power MOSFET at the full-scale current (V_Full_scale), i.e. the maximum charge/discharge current that will be encountered.

2. Using a switch-capacitor or other analog-to-digital conversion technique to convert the voltage across the battery charge/discharge power MOSFET, as a fraction of the V_Full_scale reference voltage, into a digital representation.

This digital representation is then the battery current measurement information that can be used as part of the fuel-gauging operation.

Figure 1:
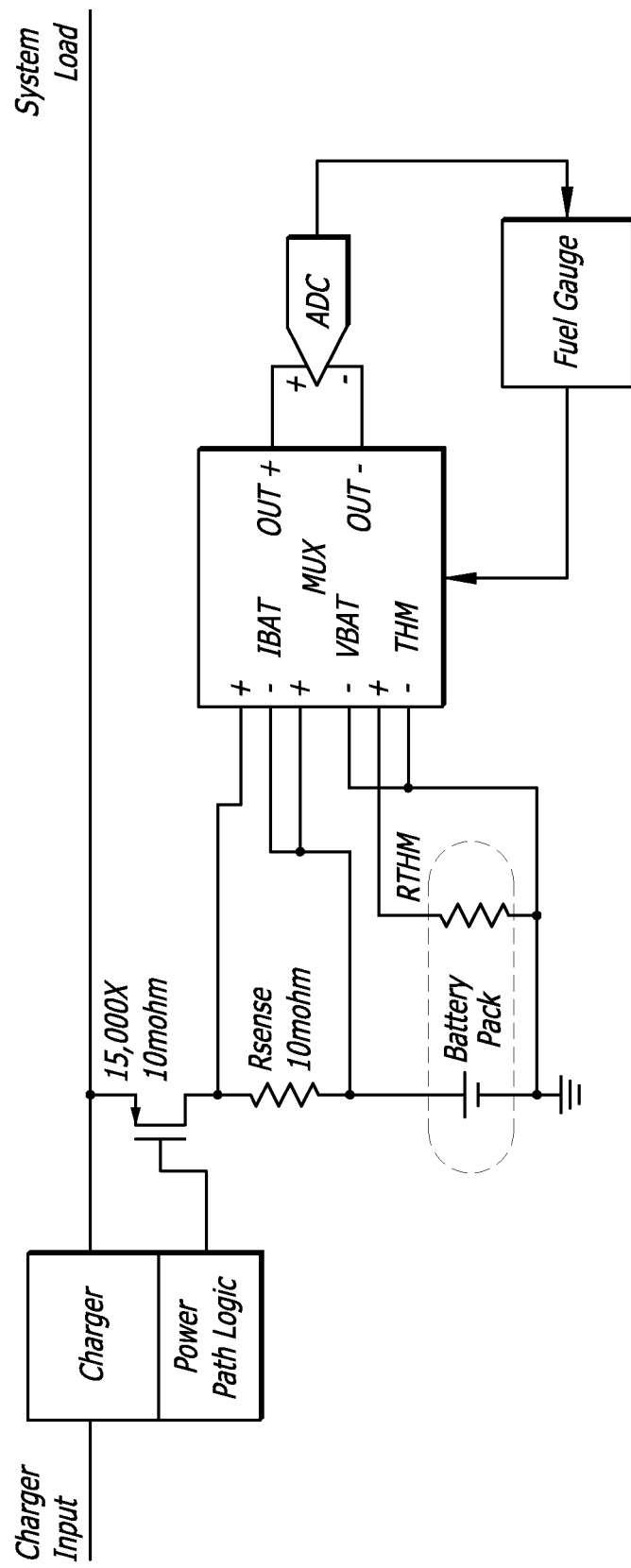
FIG. 1 is a diagram illustrating the prior art use of an extra current sense element (Rsense), which results in higher power dissipation.
Figure 2:
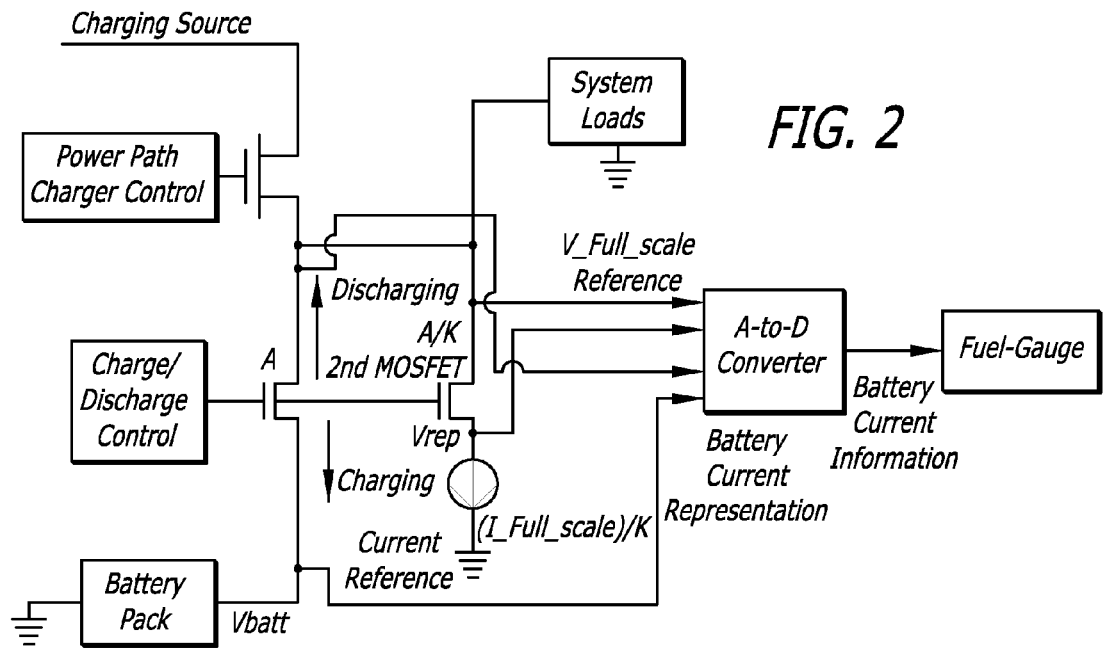
FIG. 2 is an embodiment of the present invention for operation of the charge/discharge power MOSFET in the triode region.

The foregoing is illustrated in FIG. 2. As may be seen in that Figure, the charge/discharge p-MOSFET A (having an area A) is coupled between the battery pack and the system loads and charger (p-MOSFET is used herein to mean a p-channel MOSFET). The charge/discharge p-MOSFET A is controlled by the Charge/Discharge Control, which except for an exceptionally discharged battery, will turn p-MOSFET A fully on by coupling its gate to the circuit ground whenever the battery is being charged or whenever the battery is powering the system loads. In a preferred embodiment, the body connection of p-MOSFET A is switched depending on which direction the current flows through the MOSFET, though two transistors may be used if desired. In that regard, references to a first field effect transistor (A) in the claims to follow shall be construed to be a reference to one field effect transistor or to two field effect transistors connected in series. Also references to the source and drain of the first field effect transistor (A) herein and in the claims to follow shall be to the source and drain of the first field effect transistor (A) when the battery is being charged, as the source and drain, or at least their function, reverses when the battery is being discharged through a load.

The Charger of course, is not always being powered or even connected so that the state of charge of the battery pack will vary somewhere between a fully charged state and a charge condition considered to be a fully discharged state. A $2^{nd}$ p-MOSFET A/K having an area A/K, where K is large, has its source connected to the source of the charge/discharge p-MOSFET A and its gate connected to the gate of charge/discharge p-MOSFET A and the Charge/Discharge Control circuit. The drain of the $2^{nd}$ p-MOSFET A/K is coupled to a current reference (I_Full_scale)/K. The current I_Full_scale represents the maximum current that the charge/discharge p-MOSFET A will be subjected to in that particular application. In a typical system the value of K will be on the order of 10,000, so that the current through the $2^{nd}$ p-MOSFET A/K will represent a very small power loss, a power loss that will occur only when the charge/discharge p-MOSFET A is turned on.

The voltage across the charge/discharge p-MOSFET A is applied to an A to D converter, as is the voltage across the $2^{nd}$ p-MOSFET A/K. For the gate source voltage provided by the Charge/Discharge Control to the two p-MOSFETs, the source to drain voltage of the $2^{nd}$ p-MOSFET A/K will be the voltage that would appear across the charge/discharge p-MOSFET A if it was conducting the full scale current I_Full_scale for the present gate source voltage. The actual source to drain voltage of the charge/discharge p-MOSFET A labeled Battery Current Representation in FIG. 2 will be some fraction of the voltage across the $2^{nd}$ p-MOSFET A/K depending on the actual current through p-MOSFET A, and of course will have a polarity which will depend on whether the battery pack is being charged or discharged. Accordingly, by using the source to drain voltage V_Full_scale reference of the $2^{nd}$ p-MOSFET A/K as the reference for the A to D converter and the source to drain voltage of charge/discharge p-MOSFET A as the battery current representation signal input to the A to D converter, the output of the A to D converter will represent the fraction of the full scale current I_Full_scale passing through charge/discharge p-MOSFET A at any particular time. Since the full scale current I_Full_scale is known, applying the output of the A to D converter thereto provides the battery current information in both magnitude and direction (charging or discharging) to the fuel gauge.

The embodiment of FIG. 2 assumes that the charge/discharge p-MOSFET A and the $2^{nd}$ p-MOSFET A/K are operating in the linear region and have a fixed resistance ratio (truly linear). If this is true, the source to drain voltage of charge/discharge p-MOSFET A at any time in comparison to what the source to drain voltage of charge/discharge p-MOSFET A would be if fully conducting is an accurate measure of the fraction of the full scale current passing through charge/discharge p-MOSFET A at any particular time. Under these conditions, the source to drain voltage of the $2^{nd}$ p-MOSFET A/K is what the source to drain voltage of the charge/discharge p-MOSFET A would be if conducting I_Full_scale, so the ratio of the source to drain voltage of the two p-MOSFETs provides the fraction of the full scale current that the charge/discharge p-MOSFET A is actually conducting.

Figure 3:
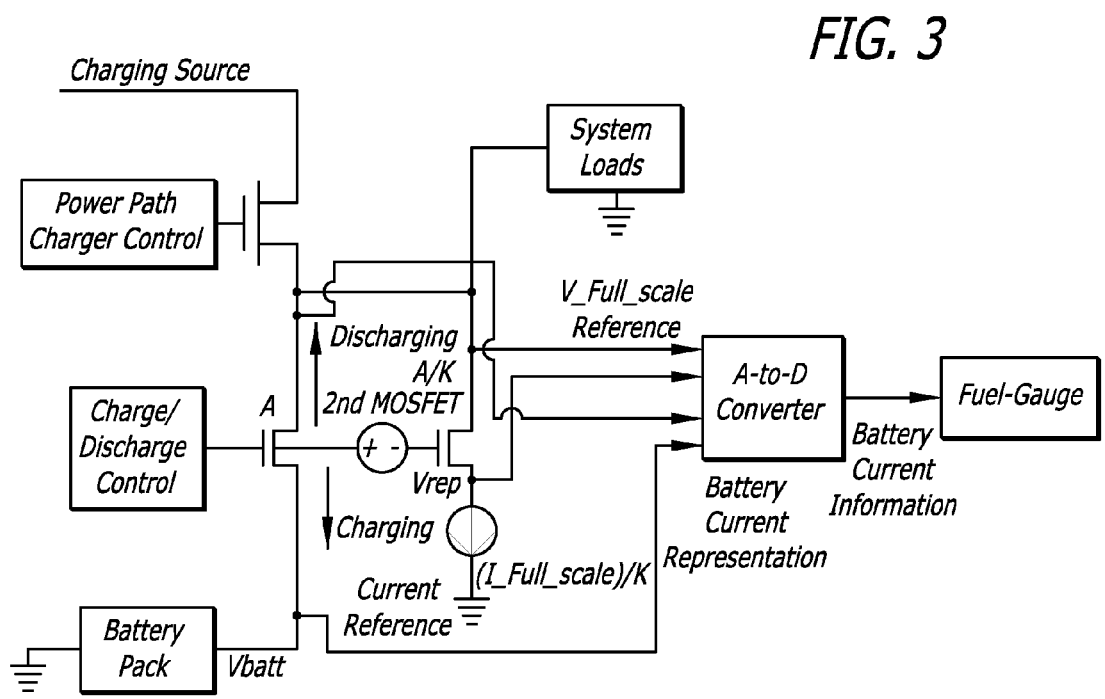
FIG. 3 shows the embodiment of FIG. 2, but with a correction for the different source drain voltages of the MOSFET A and the MOSFET A/K.

In FIG. 2, even when operating the p-MOSFET A and $2^{nd}$ A/K in the linear region, there will be an error due to the varying source to drain voltage of the $2^{nd}$ p-MOSFET A/K with the current through charge/discharge p-MOSFET A. In particular, the source voltages of the two p-MOSFETs are identical, though the drain voltages of the two p-MOSFETs are only identical when the current in the charge/discharge p-MOSFET A is equal to I_Full_scale. When the current in the charge/discharge p-MOSFET A is less, the current source I_Full_scale/K will pull the drain voltage of the $2^{nd}$ p-MOSFET A/K down so that the two p-MOSFETs are operating with different source drain voltages. This effect can be compensated for as shown in FIG. 3 by adding a compensating voltage VCOMP between the gate of the charge/discharge p-MOSFET A and the gate of the $2^{nd}$ p-MOSFET A/K.

In particular, the object of the $2^{nd}$ p-MOSFET A/K is to duplicate, on a scaled basis, the resistance of the charge/discharge p-MOSFET A so that the relative source drain voltages reflect the relative source drain currents in the two p-MOSFETs. However, in the linear region of operation of the p-MOSFETs, an increase in the source drain voltage of a p-MOSFET will not quite increase the current through the p-MOSFET proportional to that increase in source drain voltage because of the curvature of the curve of drain current versus drain to source voltage for any particular gate source voltage in the linear region. This effect may be compensated for by providing a gate voltage increment VCOMP for the $2^{nd}$ p-MOSFET A/K that is proportional to the drain source voltage of the $2^{nd}$ p-MOSFET transistor A/K. This maintains the ratio in the resistances of the two p-MOSFETs to well within the required accuracy for the system. In one embodiment, the compensation is set by considering the gate to channel voltages of the two transistors at the midpoint of the channels. In particular, referring to FIG. 3, if Vrep is less than Vbatt, then the midpoint of the channel of p-MOSFET A/K will be lower than the midpoint of p-MOSFET A by (Vbatt—Vrep)/2. Accordingly the gate voltage of p-MOSFET A/K is lower than the gate voltage of p-MOSFET A by the amount (Vbatt–Vrep)/2.

Figure 4:
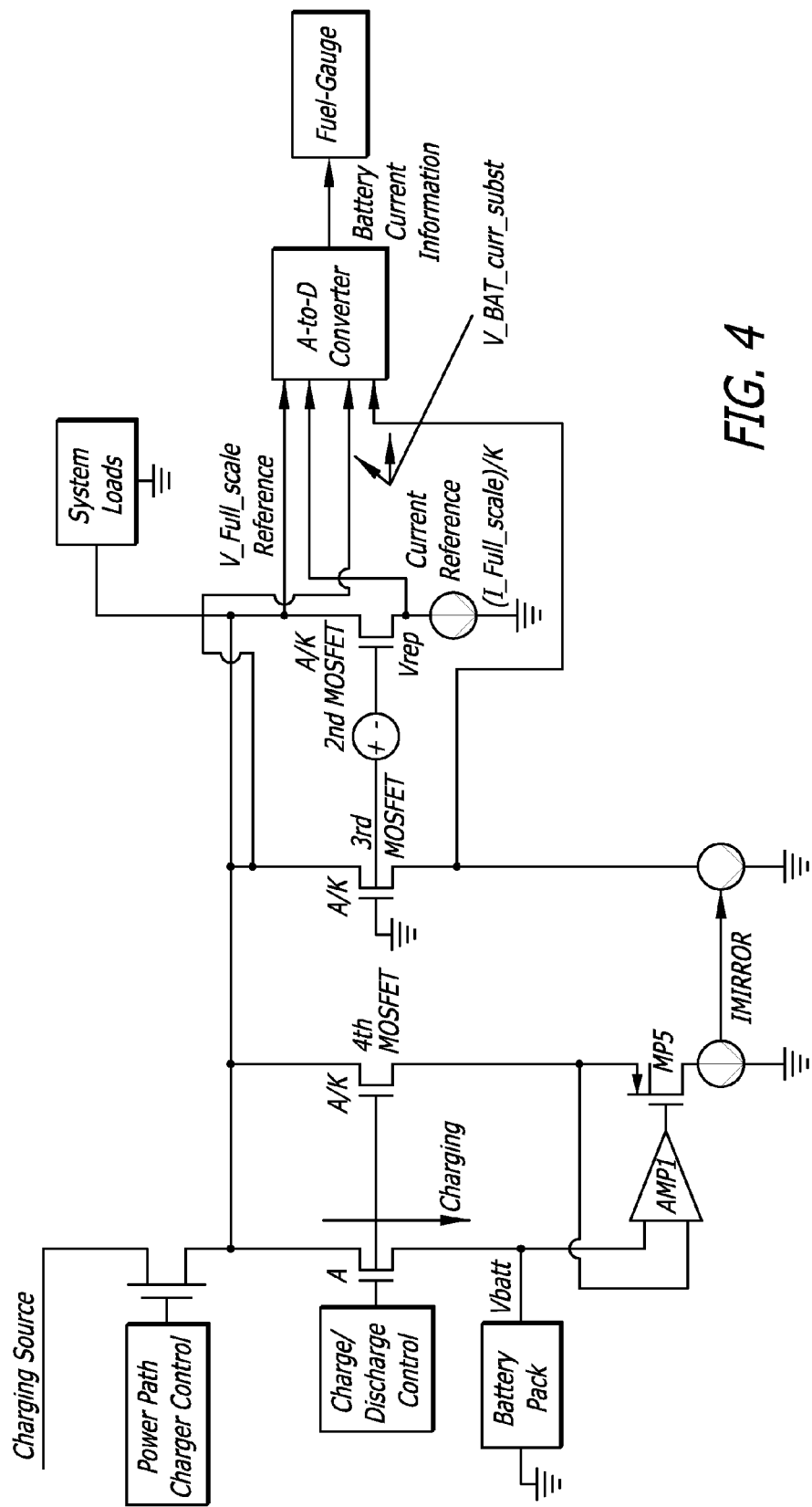
FIG. 4 illustrates an embodiment of the present invention for operation of a charge power MOSFET in the saturation region, including the correction for the different source drain voltages of FIG. 3.

Now referring to FIG. 4, a further embodiment of the present invention may be seen. This embodiment is suitable for use when the charge/discharge p-MOSFET A operates or may operate in the saturation region. This embodiment has some components that correspond to the components in the previously described embodiments, and accordingly, such description will not be repeated here. As may be seen in FIG. 4, $3^{rd}$ and $4^{th}$ MOSFETs A/K have been added, which also are p-MOSFETs and have an area A/K. In addition, a fifth p-MOS device MP5 is provided, having a gate controlled by the amplifier AMP1. Amplifier AMP1 is a differential input amplifier having an input connected to the drain of the charge/discharge p-MOSFET A and the drain of the $4^{th}$ MOSFET and controlling the gate of p-MOSFET MP5 to assure that the drain voltages for the charge/discharge p-MOSFET A and the $4^{th}$ MOSFET are equal. Accordingly the current through the $4^{th}$ MOSFET A/K will be directly proportional to (1/K times) the current through the charge/discharge p-MOSFET A, even if the same is operating in the saturation region. That current is mirrored by the current mirror IMIRROR to the drain of the $3^{rd}$ MOSFET, which has its gate connected to the circuit ground. This assures that the $3^{rd}$ MOSFET will be operating in the linear region under all circumstances, with the current flowing from the source to the drain of the $3^{rd}$ MOSFET being equal to the mirrored current IMIRROR.

In FIG. 4, note that the value of K for the 2nd and 3rd MOSFET may be different than the value of K for the $4^{th}$ MOSFET and the MOSFET A provided the current mirror IMIRROR is proportioned accordingly, though there is no reason to not use the same values of K. Also note that amplifier AMP1 assures that the drain of the $4^{th}$ MOSFET is at the same voltage as the drain of MOSFET A, and the current mirror IMIRROR forces the same current through the $3^{rd}$ MOSFET as flows through the $4^{th}$ MOSFET, so that the drain of the $3^{rd}$ MOSFET will be at the same voltage as the drain of MOSFET A, or Vbatt.

As in FIG. 3, the effect of the variation of the source drain voltage of the $2^{nd}$ MOSFET is cancelled by imposing a voltage VCOMP on its gate relative to the ground connection of the gate of the $3^{rd}$ MOSFET to cancel the resistance variation of the $2^{nd}$ MOSFET with its source to drain voltage. Accordingly, the embodiment of FIG. 4 may be used wherein the main charge p-MOSFET is operating in the saturation region, though its use is not so limited, as the circuit will operate equally as well if the main charge p-MOSFET A is operated in the linear region. However it only operates in one direction, so to speak, rather than during charging and discharging. However this and the earlier described embodiments my be used in applications beyond battery chargers, such as any application wherein currents through switching transistors needs to be monitored and a sense resistor is not attractive because of its size, cost, voltage and power loss, or any other reason.

Figure 5:
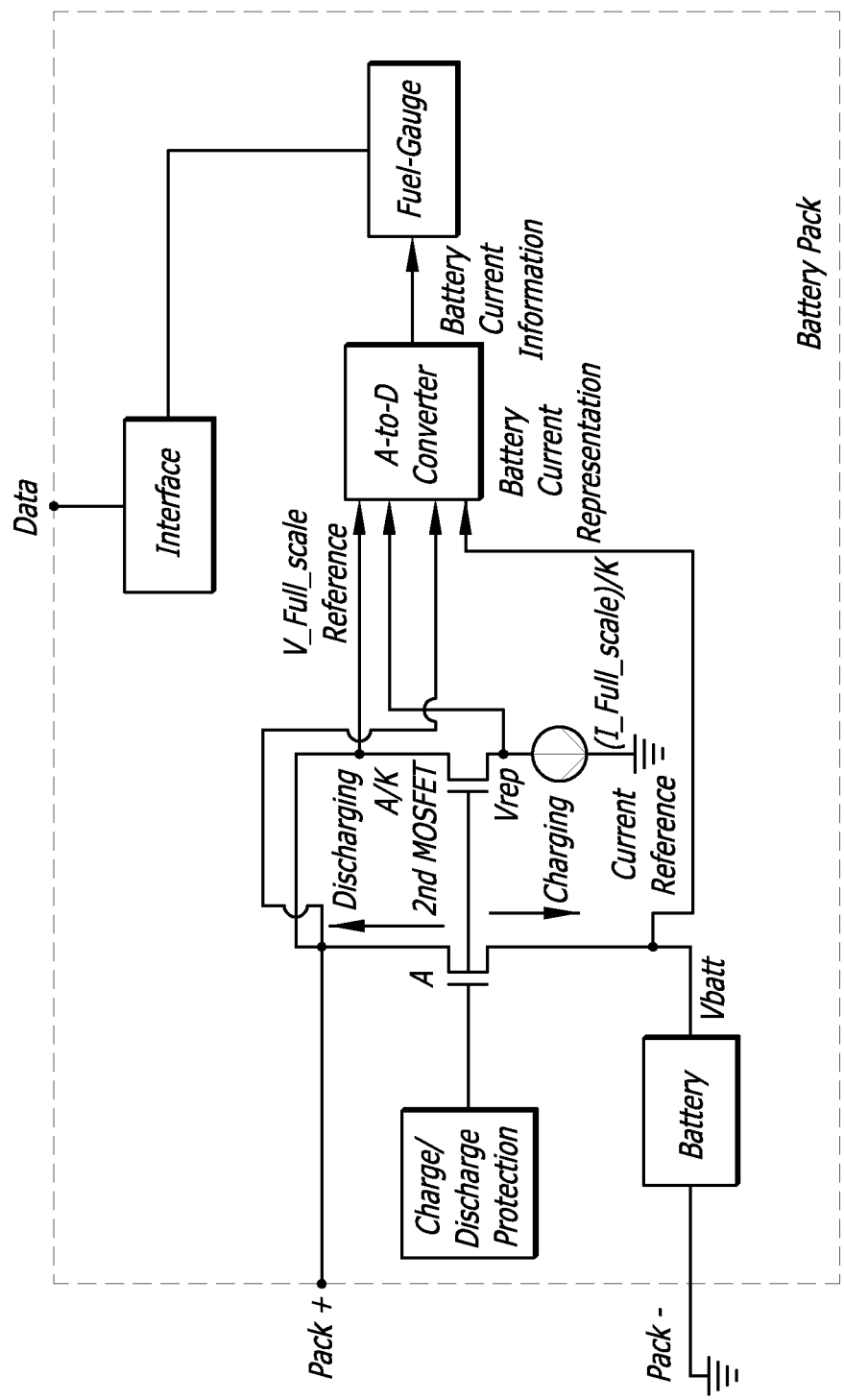
FIG. 5 illustrates an embodiment similar to that of FIG. 2 as incorporated into a battery pack.
Figure 6:
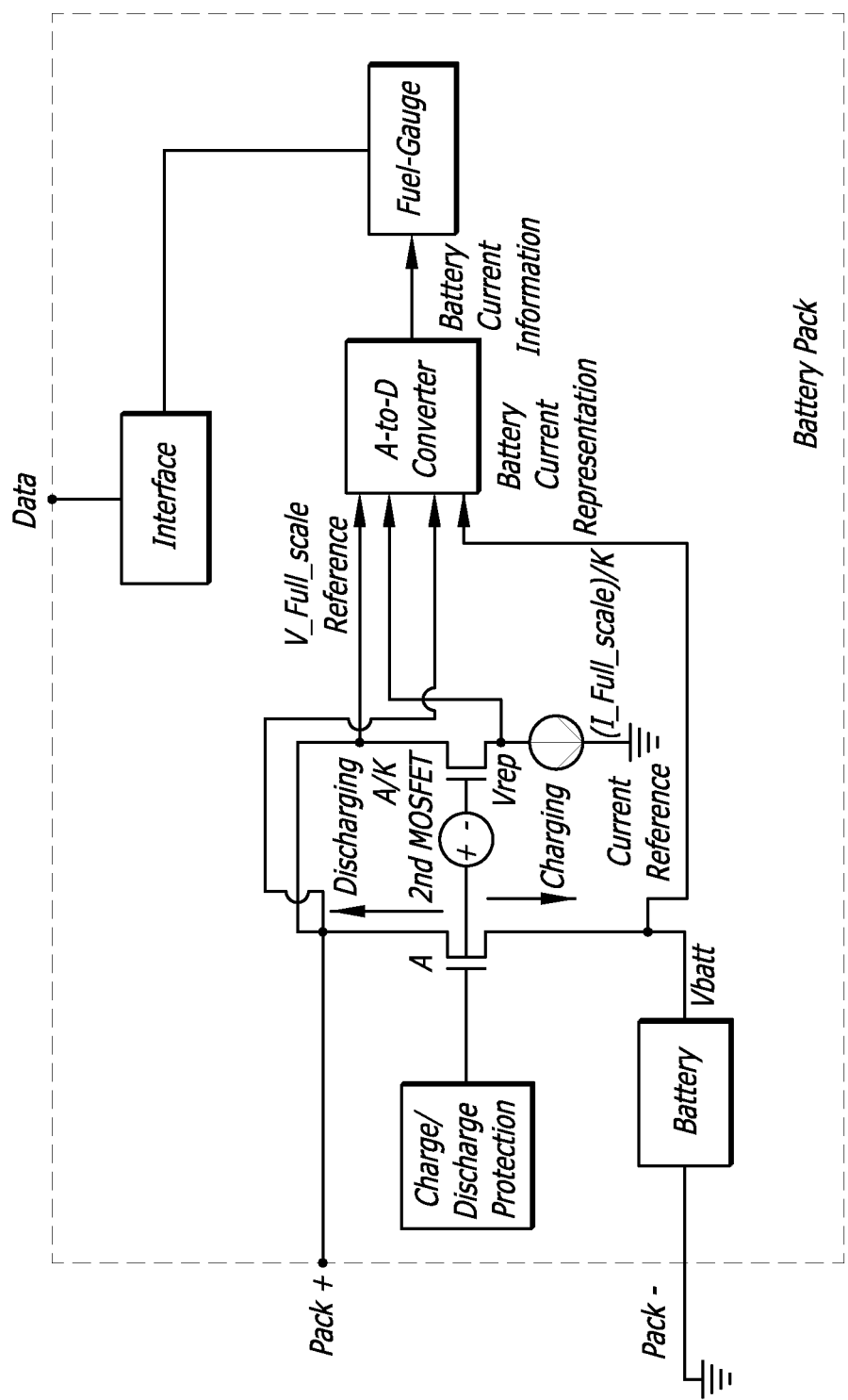
FIG. 6 illustrates an embodiment similar to that of FIG. 3 as incorporated into a battery pack.

Now referring to FIG. 5, another embodiment of the present invention may be seen. The concept of this embodiment is that the integrated MOSFET current sensing circuit is included within the battery pack itself, and accordingly has the capability of disconnecting the battery when excessive loads or excessive charging currents would otherwise occur. FIG. 5 illustrates an embodiment similar to that of FIG. 2 incorporated within the battery pack, with an interface coupled to the fuel gauge for communication with the system controller. In this way, the sense resistor of the prior art in the battery pack is eliminated, as is a sense resistor and coupling transistor or transistors of the prior art outside of the battery pack. This results in significant cost savings as well as the improvement of battery performance for a given battery. FIG. 6 is similar and incorporates an embodiment similar to that of FIG. 3 hereinbefore described, again with a fuel gauge coupled to an interface to provide communication capabilities through the data port. In that regard, high data rates are not required and accordingly relatively simple interfaces may be used, such as by way of example, I²C, and 1-Wire®, a serial communication system of Dallas Semiconductor, now a wholly owned subsidiary of Maxim Integrated Products, assignee of the present invention. When the sensor is located in a battery pack, the sensor may also turn off the main transistor p-MOSFET A when the current starts to become excessive by limiting the range of the analog to digital converter to something less than a full count output, so that anything somewhat over this count may be considered an excessive current.

In essence, the circuits of the present invention provide battery current information in the form of amplitude and direction of current flow, which may be integrated to provide a Coulomb counter type output. The preferred use of the present invention is with a voltage fuel gauge which combines the best characteristics of battery modeling with the best characteristics of Coulomb counters to provide a state of charge of the battery pack that has good short term characteristics, as determined primarily by the Coulomb counter, as well as good long term characteristics as provided primarily by the battery modeling, regardless of whether the battery pack is ever fully charged or fully discharged. Thus the battery modeling essentially eliminates the long term drift characteristic of Coulomb counters while essentially eliminating short term inaccuracies in the battery modeling by the Coulomb counter. This allows high accuracy in monitoring the state of charge of the battery pack under all states of operation of the battery pack, independent of its rate of charging, its rate of discharging or its rate of self discharging during non-use.

The present invention has been illustrated using an exemplary embodiment implementing p-MOSFETs, though other device types, such as but not limited to n-MOSFETs, and other circuitry may be used as desired. Thus while preferred embodiments of the present invention have been disclosed and described herein for purposes of illustration and not for purposes of limitation, it will be understood by those skilled in the art that various changes in form and detail may be made therein without departing from the spirit and scope of the invention.

What is claimed is:

1. In a current sensor for sensing current flow through a field effect transistor, apparatus comprising:
   a first field effect transistor;
   a second field effect transistor, the first and second field effect transistors being of the same type, each having a source, a drain and a gate;
   the sources of the first and second field effect transistors being coupled together, and the gates of the first and second field effect transistors being coupled together;
   the drain of the second field effect transistor being coupled to a current source; and
   circuitry coupled to the sources and drains of the first and second field effect transistors for providing an output indicative of the current flowing through the first field effect transistor.

2. The current sensor of claim 1 wherein the circuitry coupled to the sources and drains of the first and second field effect transistors for providing an output indicative of the current flowing through the first field effect transistor comprises circuitry responsive to the source to drain voltage of the first field effect transistor relative to the source to drain voltage of the second field effect transistor.

3. The current sensor of claim 2 wherein the circuitry responsive to the ratio of the source to drain voltage of the second field effect transistor to the source to drain voltage of the first field effect transistor comprises an analog to digital converter, the analog to digital converter having the source to drain voltage of the second field effect transistor as a reference and the source to drain voltage of the first field effect transistor as an input.

4. The current sensor of claim 1 wherein the gates of the first and second field effect transistors are coupled together through a voltage source to provide a correction to the gate voltage of the second field effect transistor for the different drain voltages of the first and second field effect transistors.

5. The current sensor of claim 4 wherein the voltage source is a voltage having an amplitude equal to the difference in drain voltages between the first and second field effect transistors, divided by 2.

6. The current sensor of claim 5 wherein the first field effect transistor is the field effect transistor through which the current sensor is to sense current flow.

7. The current sensor of claim 6 wherein the first field effect transistor has a larger area than the second field effect transistor.

8. The current sensor of claim 1 further comprising:
   third and fourth field effect transistors, the first, second and fourth field effect transistors having a smaller area than the third field effect transistor;
   the first, second, third and fourth field effect transistors having their sources coupled together, and the third and fourth field effect transistors having their gates coupled together;
   circuitry holding the drains of the third and fourth field effect transistors at the same voltage;
   a current mirror mirroring the current in the drain of the fourth field effect transistor to the drain of the first field effect transistor;
   the gate of the first field effect transistor being biased so that the first field effect transistor operates in a linear region;
   the third field effect transistor being the field effect transistor through which the current sensor is to sense current flow, which current flow is proportional to the current flow in the first field effect transistor.

9. The current sensor of claim 8 wherein the circuitry coupled to the sources and drains of the first and second field effect transistors for providing an output indicative of the current flowing through the first field effect transistor comprises circuitry responsive to the source to drain voltage of the first field effect transistor relative to the source to drain voltage of the second field effect transistor.

10. The current sensor of claim 9 wherein the circuitry responsive to the source to drain voltage of the first field effect transistor relative to the source to drain voltage of the second field effect transistor comprises an analog to digital converter, the analog to digital converter having the source to drain voltage of the second field effect transistor as a reference and the source to drain voltage of the first field effect transistor as an input.

11. The current sensor of claim 1 further comprised of:
   a battery pack;
   an analog to digital converter responsive to the source to drain voltage of the second field effect transistor relative to the source to drain voltage of the first field effect transistor;
   a fuel gauge coupled to an output of the analog to digital converter;
   an interface coupled to an output of the fuel gauge;
   the sensor, analog to digital converter, fuel gauge, and interface being located in the battery pack;
   the interface being accessible from outside the battery pack.

12. The current sensor of claim 11 wherein the sensor is configured to turn off the first field effect transistor when the current though the first field effect transistor starts to become excessive.

13. In a current sensor for sensing current flow through a first field effect transistor, apparatus comprising:
   a second field effect transistor, the first and second field effect transistors being of the same type, each having a source, a drain and a gate, the second field effect transistor being smaller than the first field effect transistor;
   the sources of the first and second field effect transistors being coupled together, and the gates of the first and second field effect transistors being coupled together;
   the drain of the second field effect transistor being coupled to a current source; and
   circuitry coupled to the sources and drains of the first and second field effect transistors and responsive to the source to drain voltage of the first field effect transistor relative to the source to drain voltage of the second field effect transistor for providing an output indicative of the current flowing through the first field effect transistor.

14. The current sensor of claim 13 wherein the circuitry responsive to the source to drain voltage of the second field effect transistor relative to the source to drain voltage of the first field effect transistor comprises an analog to digital converter, the analog to digital converter having the source to drain voltage of the second field effect transistor as a reference and the source to drain voltage of the first field effect transistor as an input.

15. The current sensor of claim 13 wherein the gates of the first and second field effect transistors are coupled together through a voltage source to provide a correction to the gate voltage of the second field effect transistor for the different drain voltages of the first and second field effect transistors.

16. The current sensor of claim 15 wherein the voltage source is a voltage having an amplitude equal to the difference in drain voltages between the first and second field effect transistors, divided by 2.

17. In a current sensor for sensing current flow through a first field effect transistor, apparatus comprising:
   second, third and fourth field effect transistors, all of the same type and all having a smaller area than the first field effect transistor, each field effect transistor having a source, a drain and a gate;
   the sources of all the field effect transistors being coupled together, the gates of the first and second field effect transistors being coupled together, and the gates of the third and fourth field effect transistors being coupled together;
   circuitry holding the drains of the first and second field effect transistors at the same voltage;
   a current mirror mirroring the current in the drain of the second field effect transistor to the drain of the third field effect transistor;
   the gate of the third field effect transistor being biased so that the third field effect transistor operates in a linear region;
   the drain of the fourth field effect transistor being coupled to a current source; and
   circuitry coupled to the sources and drains of the third and fourth field effect transistors for providing an output indicative of the current flowing through the first field effect transistor.

18. The current sensor of claim 17 wherein the circuitry coupled to the sources and drains of the third and fourth field effect transistors for providing an output indicative of the current flowing through the first field effect transistor comprises circuitry responsive to the source to drain voltage of the third field effect transistor relative to the source to drain voltage of the fourth field effect transistor.

19. The current sensor of claim 17 wherein the circuitry responsive to the source to drain voltage of the third field effect transistor relative to the source to drain voltage of the fourth field effect transistor comprises an analog to digital converter, the analog to digital converter having the source to drain voltage of the fourth field effect transistor as a reference and the source to drain voltage of the third field effect transistor as an input.

* * * * *